United States Patent
Krassnitzer et al.

(10) Patent No.: US 10,253,407 B2
(45) Date of Patent: Apr. 9, 2019

(54) ARC DEPOSITION SOURCE HAVING A DEFINED ELECTRIC FIELD

(75) Inventors: Siegfried Krassnitzer, Feldkirch (AT); Juerg Hagmann, Sax (CH)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 13/805,730

(22) PCT Filed: Jun. 3, 2011

(86) PCT No.: PCT/EP2011/002734
§ 371 (c)(1),
(2), (4) Date: Feb. 4, 2013

(87) PCT Pub. No.: WO2011/160766
PCT Pub. Date: Dec. 29, 2011

(65) Prior Publication Data
US 2013/0126347 A1    May 23, 2013

Related U.S. Application Data

(60) Provisional application No. 61/357,272, filed on Jun. 22, 2010.

(51) Int. Cl.
*C23C 14/35* (2006.01)
*C23C 14/00* (2006.01)
(Continued)

(52) U.S. Cl.
CPC .......... *C23C 14/35* (2013.01); *C23C 14/0089* (2013.01); *C23C 14/021* (2013.01);
(Continued)

(58) Field of Classification Search
CPC .............. C23C 14/0089; C23C 14/021; C23C 14/5873; C23C 14/35; C23C 14/325; H01J 37/32055
(Continued)

(56) References Cited

U.S. PATENT DOCUMENTS

| 3,625,848 A | 12/1971 | Snaper |
| 4,551,221 A | 11/1985 | Axenov et al. |

(Continued)

FOREIGN PATENT DOCUMENTS

| EP | 1189258 A2 * | 3/2002 | ........ H01J 37/32055 |
| EP | 1970464 A1 | 9/2008 | |
| JP | 2001158958 A * | 6/2001 | |

OTHER PUBLICATIONS

Machine Translation JP2001158958A.*
International Search Report for PCT/EP2011/002734 dated Sep. 23, 2011.

*Primary Examiner* — Michael A Band
(74) *Attorney, Agent, or Firm* — Pearne & Gordon LLP (57) ABSTRACT

The invention relates to an arc deposition device, comprising a cathode, an anode, as well as a voltage source for putting the anode at positive potential relative to the cathode. The device also comprises magnetic elements, which cause a magnetic field over the cathode surface, wherein the anode is arranged in the vicinity of the cathode in such a way that the magnetic field lines exiting from the cathode surface hit the anode.

10 Claims, 5 Drawing Sheets

(51) Int. Cl.
    *C23C 14/02* (2006.01)
    *C23C 14/32* (2006.01)
    *C23C 14/58* (2006.01)
    *H01J 37/32* (2006.01)

(52) U.S. Cl.
    CPC ........ *C23C 14/325* (2013.01); *C23C 14/5873* (2013.01); *H01J 37/32055* (2013.01)

(58) Field of Classification Search
    USPC .................................................. 204/298.41
    See application file for complete search history.

(56) References Cited

U.S. PATENT DOCUMENTS

| | | | |
|---|---|---|---|
| 4,620,913 A | | 11/1986 | Bergman |
| 5,306,407 A | | 4/1994 | Hauzer et al. |
| 5,380,421 A | * | 1/1995 | Gorokhovsky ....... C23C 14/325 |
| | | | 204/192.38 |
| 6,663,755 B2 | * | 12/2003 | Gorokhovsky .......... 204/298.41 |
| 6,998,034 B2 | * | 2/2006 | Setoyama et al. ....... 204/298.41 |

* cited by examiner

Figure 11 ental claims, different advantageous embodiments of the inventive arc deposition source are described.

ARC DEPOSITION SOURCE HAVING A DEFINED ELECTRIC FIELD

The invention relates to an arc deposition device according to the preamble of claim 1. In the present description, an arc deposition device refers to a device with the aid of which an electric arc whose arc spot is on a cathode can be ignited under vacuum, wherein the material to be evaporated is made available by the cathode (=target) and the arc spot results in the evaporation of the target material.

Figure 1:
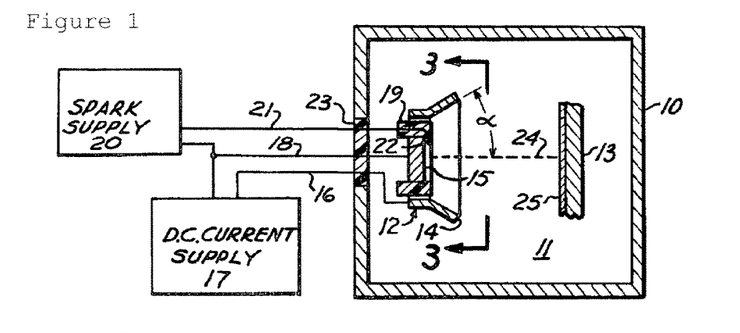
FIG. 1 shows an arc deposition source according to the state of the art.

Arc deposition sources are known in the state of the art, Snaper discloses in U.S. Pat. No. 3,625,848 a beam gun with a cathode and an anode that are arranged in such a manner that a spark discharge occurs between them. The cathode in this case is made of the material that is to be deposited. The anode described therein has a tapering geometry and is placed in the immediate vicinity of the cylindrical cathode. The arrangement according to this state of the art is shown in FIG. 1. Magnetic means are not used in this arrangement. The movement of the arc spot on the target would thus be very slow by today's standards, although they were described at the time as being fast. A slow movement of the arc spot causes among other things an Increased roughness of the layers produced by means of the arc deposition source.

By contrast, patent document U.S. Pat. No. 4,620,913 by Clark Bergman discloses a multi arc vacuum system in which magnetic means are used. This is an arc source with anode array, wherein the chamber or an electrically insulated introduced anode is used. The resulting disadvantage is that merely part of the magnetic fields exiting from the target lead into the anode. The advantage of the apparatus therein is a stable spark guiding, especially at low discharge currents. A current distribution between the chamber and the introduced anode is achieved by additionally supplying a positive voltage to the introduced anode.

There is therefore a need for an arc deposition source that makes it possible to produce layers with low surface roughness at a constantly high evaporation rate. It is the aim of the present invention to propose such an arc deposition source.

According to the invention, the aim is achieved with the arc deposition source according to claim 1. In the dependent claims, different advantageous embodiments of the inventive arc deposition source are described.

The inventive arc deposition source comprises a cathode (target), an anode and magnetic means that enable the magnetic field lines to lead from the target surface to the anode in a short connection.

The anode is placed in the direct vicinity of the cathode so that the connection of the cathode with the anode is ensured over magnetic field lines from any point of the target surface to be evaporated and which is subjected to erosion.

In this connection, the magnetic means are designed in such a way that the component parallel to the target surface is considerably larger than the component perpendicular to the target surface. Magnetic field forces of up to 500 Gauss can be used, i.e. considerably higher field forces than the magnetic field forces otherwise used in PVD technology.

The arc source thus described exhibits, by comparison with the state of the art, higher coating rates with simultaneously very smooth layers.

The inventive arc source can even be operated in vacuum, with a high spark speed being achieved. The arc source is then operated in metal mode. The metal ions thus generated, such as e.g. Cr+, Ti+, can arrive undisturbed onto the substrate and be used for the purpose of metal on etching. Operation with low discharge current is possible.

By means of so-called "pre-biasing", it is possible with the inventive anode to reliably adjust the on energy.

The invention will now be explained by way of example and with the aid of the figures.

Figure 2:
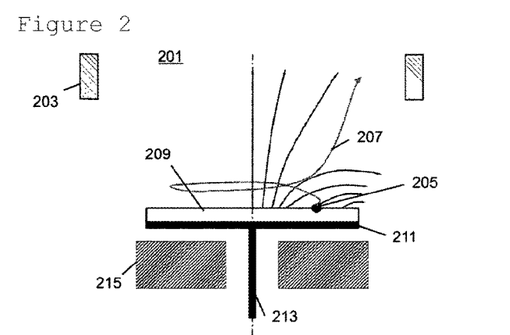
FIG. 2 shows an arc deposition source according to the state of the art.

To gain a better understanding of the invention, the situation with arc sources according to the state of the art will be broadly discussed. FIG. 2 shows an arc evaporation arrangement 201 with an anode 203 at a distance from the source cathode 209 according to the state of the art The source cathode is cooled by means of a cooling device 211 and is connected with the negative pole 213 of a DC current supply. Behind the source cathode, magnetic means 215 are provided which ensure a magnetic field is generated above the target surface. An arc spot 205 releases a high current and thus a plurality of electrons in the evaporation chamber. The arc plasma is available as conductive medium. In the state of the art, since the anode 203 is not in the direct vicinity of the arc spot 205, the charged particles must cross the magnetic field on their way to the further removed anode. What is relevant is the movement of a charged particle with a charge q, mass m, speed v at the location r in an electric field $E(r)$ and a magnetic field $B(r)$. In this connection, various force components will be acting: for the movement parallel to the B field, a force proportional to $qE$ will be acting; for the movement perpendicular to the magnetic field, the force proportional to $q(E\perp + v\perp \times B)$, will be acting, which results in a gyration movement which is however overlaid by an E×B drift. This leads to a "virtual" current path 207 as indicated in FIG. 2. When travelling this path reminiscent of a spiral on its way to the remote anode 203, the working gas (e.g. Ar, $N_2$) present in the coating chamber is highly ionized. This results in the formation of gas ions, in a voltage increase of the discharge and in a jump of potential in front of the cathode. Furthermore, a reduction of the coating rate can be observed.

Figure 3:
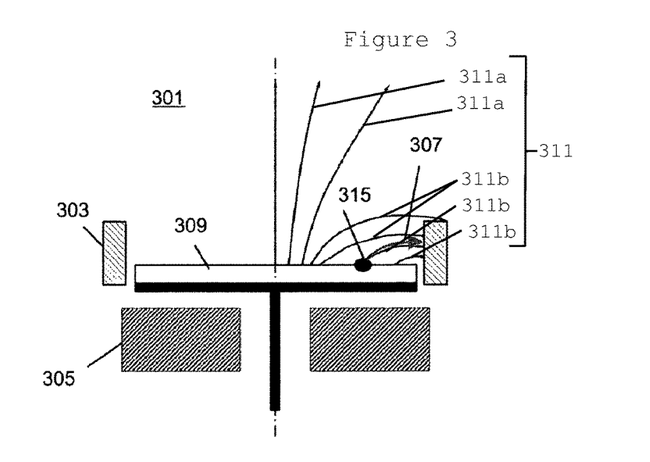
FIG. 3 shows a first embodiment of an inventive arc deposition source.

FIG. 3 shows an embodiment of the inventive arc deposition source 301. This is only a variant given by way of example and can be achieved through very different executions. The cathode 309 consists of the material to be evaporated and is connected to the negative pole of a current source through the power connection. Through the magnetic means 305, a magnetic field is generated on the cathode surface that enables a fast movement of the spark.

The magnetic field lines 311 that exit from the target surface are designed within a large portion of the area in such a way that they exhibit mainly components parallel to the surface of the cathode 309 and enable a short connection to the anode 303 extending in a ring-shape around the cathode edge. The arc deposition source represented in FIG. 3 can however be executed both as an axially symmetrical circular cathode and as a rectangular cathode. Cathode areas in the center resp. along the middle line will always exhibit field lines 311a running perpendicular to the target surface and should thus be excluded from the erosion. This can be achieved for example by means of a shutter or by means of a filled recess (both not represented). The magnetic field force in the area 6 amounts to 40 to 500 Gauss. A range between 60 and 100 Gauss has proved advantageous and between 200 and 500 Gauss particularly advantageous for especially smooth layer results. The inventive arrangement of the anode in combination with the magnetic field distribution enables operation with such high magnetic fields. The usual materials for mechanically resistant coatings, such as Ti, TiAl, AlCr, TiSi, Cr etc., can be used as target material of the cathode 309.

In an arc evaporation arrangement 301 according to FIG. 3, the anode 303 in combination with the magnetic field generated by the magnetic means 305 is placed according to the invention in the vicinity of the cathode 309, so that the magnetic field lines 311b enable the current path 307 in a direct line from the arc spot 315 to the anode 303. A drift as described above can essentially be avoided when the electric field runs essentially parallel to the magnetic field. In an advantageous embodiment of the present invention, the anode is designed in such a way that this is achieved at applied voltage and active magnetic field and nearly all or at least the majority of the magnetic field lines 311 with the exception of the central magnetic field lines 311a lead to the anode. The path of the electrons is characterized by the Larmor radius and describes a gyration around the field line path. The gyration radius for an electron amounts for 10 Gauss to approx. 1 mm and for 100Gauss to approx. 0.1 mm. At the corresponding magnetic field forces, the path is thus well localized along the field line 311b. The effect of such an arrangement is a reduction of the total discharge voltage and an increase of the coating rate. The working gas in the vicinity of the target is only negligibly ionized.

A possible advantageous use of the present invention is metal magnetron on etching (MIE).

Figure 4:
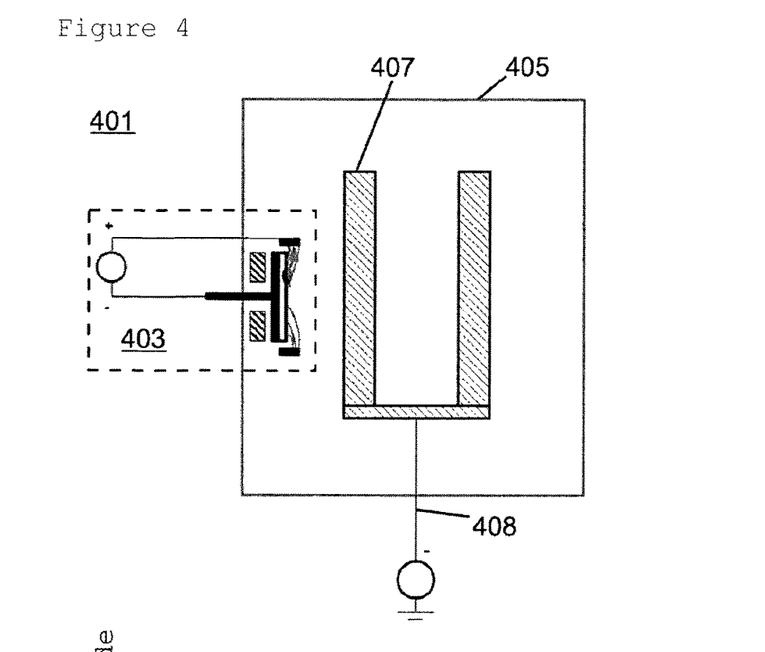
FIG. 4 shows a vacuum device with an inventive arc deposition source.

This is possible due to a further characteristic of the inventive arc deposition source. The characteristic consists in the possibility of a stable operation even without working gas under vacuum with pressures lower than 1E-03Pa. The good electric connection of the arc spot at the anode makes it possible for the electric conductivity of the metal plasma to be sufficient to carry the current from the cathode to the anode. The metal steam from the arc source is singly and highly ionized to a high degree and can be accelerated through the bias voltage onto the substrate. This enables a magnetron ion etching (MIE) to be effectively achieved. A corresponding MIE device 401 is shown in FIG. 4: it comprises an arc deposition source 403 and a substrate holder 407 which are arranged in a vacuum chamber 405. The substrate holder, fitted with substrates to be etched (not represented) is set to negative potential by means of a voltage source 408, thus accelerating the positive ions generated at the arc deposition source towards the substrates.

It is noteworthy that the operation in vacuum can be maintained at very low current strengths: when selecting the parameter ranges for the above mentioned MIE process, it was surprising that even at very low discharge currents of the arc discharge, a stable process is possible. Due to the magnetic field lines, the potential of the anode is "carried over" up to shortly before the target surface, by means of which the current path can be maintained.

For aluminum, a stable process could be observed at current strengths down to just above 10A and for titanium at current strengths down to just above 40A. With the inventive arc deposition source, metal on etching can also be performed in a stable manner with other materials, such as for example Cr, Nb, Ta and other metals with high ionization degree and high proportion of multiple ionization.

The inventive arc deposition source can be made with different arrays, which themselves are in turn inventive.

First, again for a better understanding, the situation will be sketched where an arc deposition source according to the state of the art is used. An arrangement according to the state of the art is accordingly represented in FIG. 5.

Figure 5:
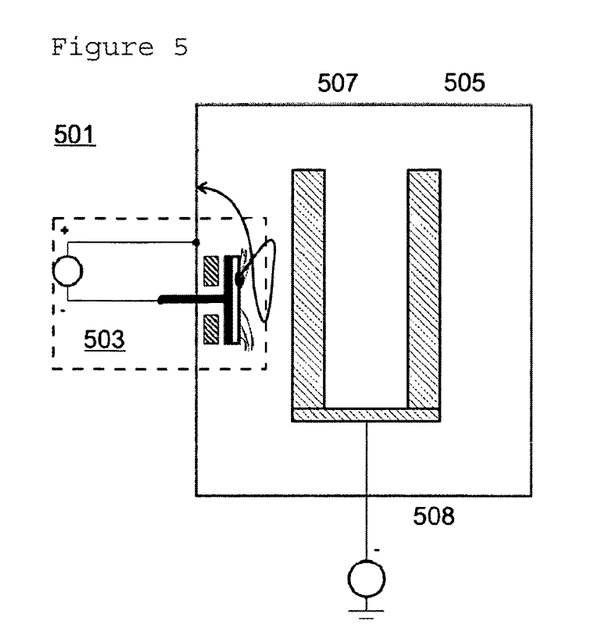
FIG. 5 shows a vacuum device with an arc deposition source according to the state of the art.
Figure 6:
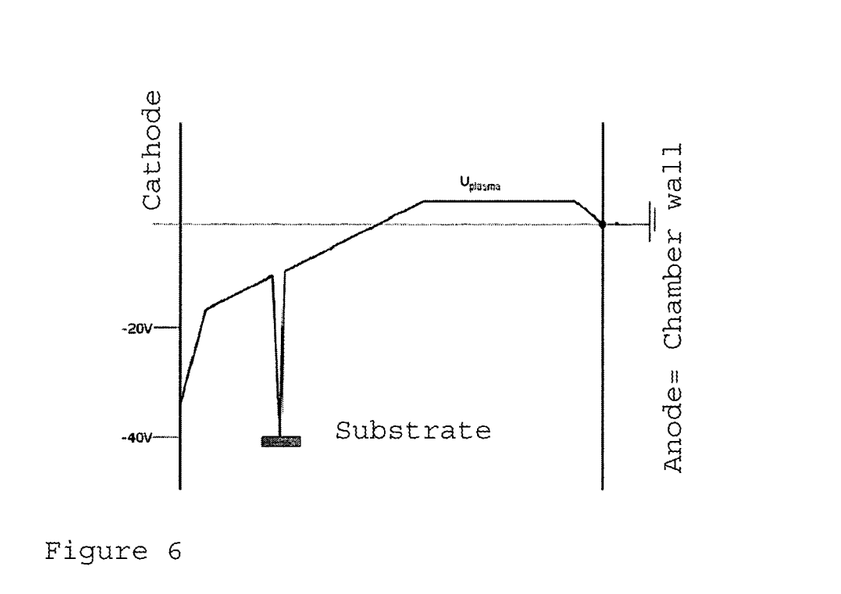
FIG. 6 shows the potential ratios with a device according to FIG. 5.

In this context, the chamber wall of the vacuum chamber 505 forms the anode. The magnetic field lines that exit From the target have no direct connection with the anode. FIG. 5 shows a coating device 501 with an arc deposition source 503 that is placed in a vacuum chamber 505, a substrate holder 507 being further placed in the vacuum chamber 505 and being capable of being set to negative voltage by means of a voltage source 508. Especially at high magnetic field forces, which have a positive impact on the layer roughness, the working gas (e.g. $N_2$) is strongly ionized and therefore the discharge voltage is increased resp. a drop of potential occurs in front of the target. Furthermore, the high electron temperature of the discharges (2 eV-5 eV) results in a distortion of the potential in front of the substrate, as sketched in FIG. 6.

By contrast, an inventive embodiment has been outlined in FIG. 4 and has been already explained to a large extent.

The cathode material evaporated with a high degree of ionization is accelerated through a bias voltage 408 onto the substrate, The electric system cathode 1 and anode 4 is executed floatingly relative to the chamber mass 10.

The plasma potential $U_{plasma}$ in this embodiment is bound to the chamber wall.

Figure 7:
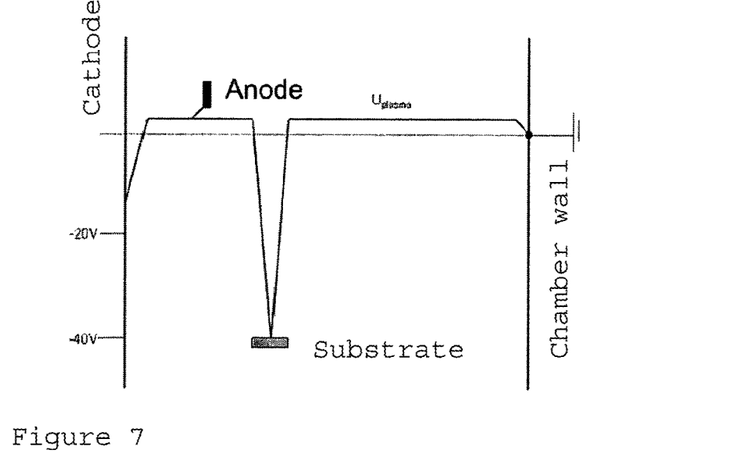
FIG. 7 shows the potential ratios with an inventive device according to FIG. 4.

The discharge current of the arc source flows from the cathode to the anode. The cathode voltage in this example of approx. −16 to −25V is formed against the anode 4. The substrate bias from the generator 408 accelerates ions from the plasma with a plasma potential $U_{plasma}$ against the substrate. The behavior of the potential in front of the substrate is, as represented in FIG. 7, no longer distorted, since the electron temperature of such a plasma is merely approx. 0.3 eV to 1 eV.

Figure 8:
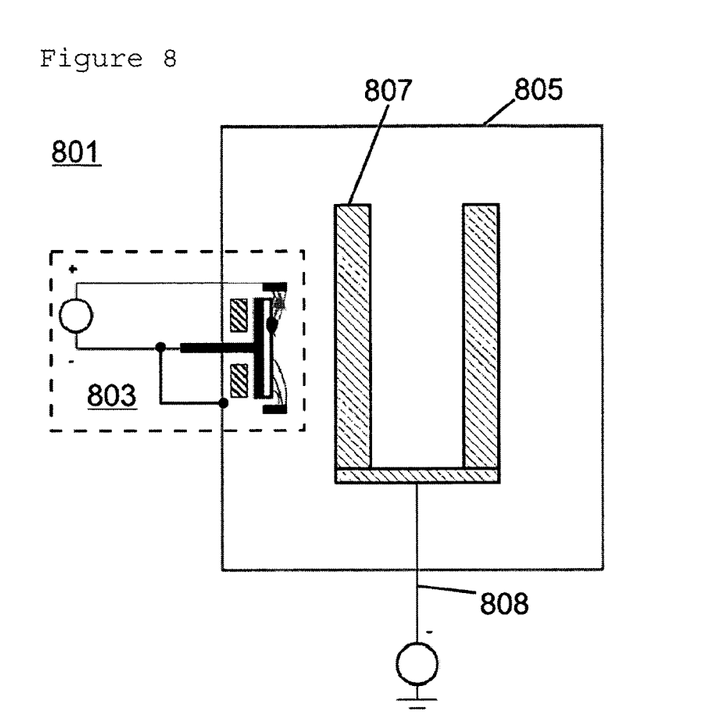
FIG. 8 shows a further embodiment of the inventive vacuum device.
Figure 9:
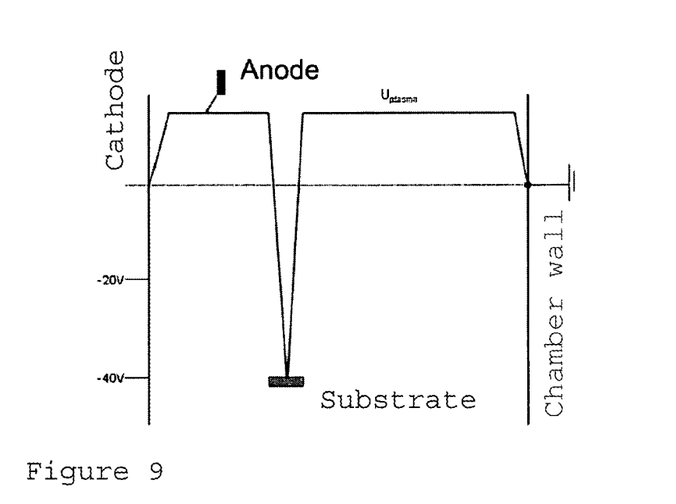
FIG. 9 shows the potential ratios with an inventive device according to FIG. 8.
Figure 10:
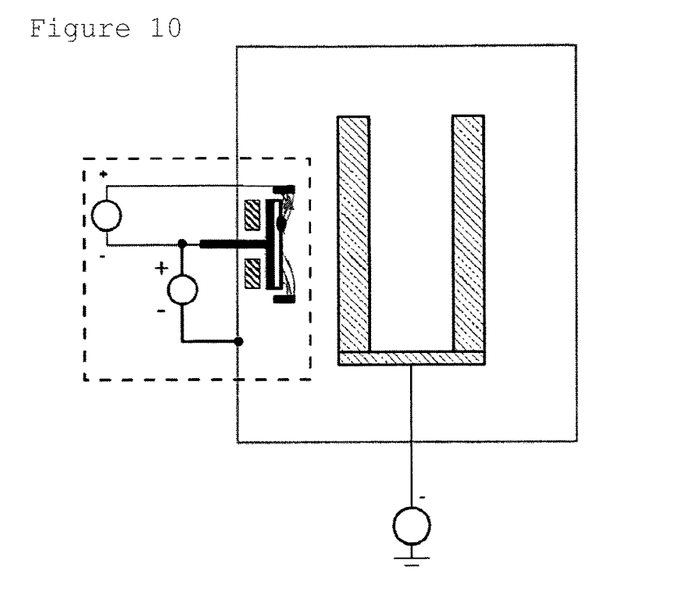
FIG. 10 shows a further embodiment of an inventive vacuum device.
Figure 11:
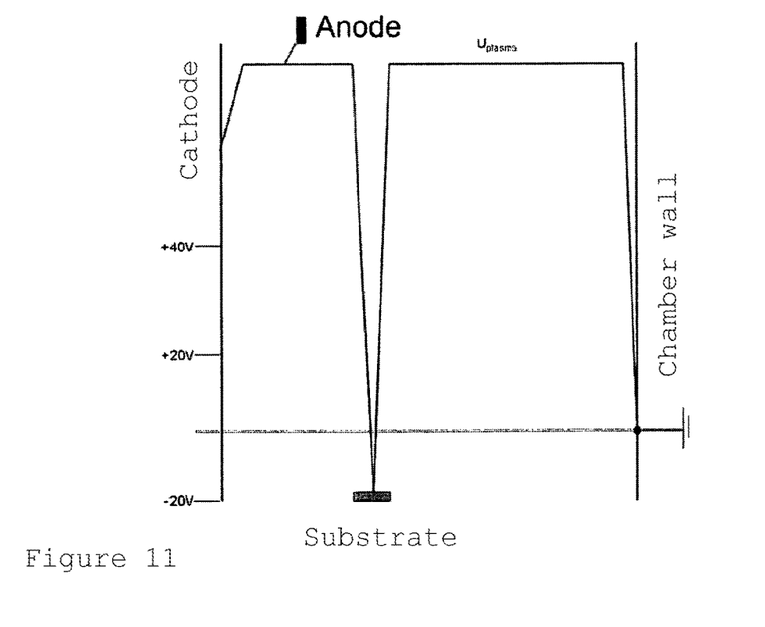
FIG. 11 shows the potential ratios with an inventive device according to FIG. 10.

A further embodiment is shown in FIG. 8, namely a coating device 801 with an arc deposition source 803 placed in a vacuum chamber 805, wherein a substrate holder 807, that can be set to a negative voltage by means of a voltage source 808, is further paced in the vacuum chamber, According to this embodiment, in contrast to FIG. 4, the cathode of the floating cathode-anode system of FIG. 4 is connected to the chamber mass (ground). The potentials are then shifted, as represented in FIG. 9. The cathode potential is shifted towards the chamber mass. The arc discharge current runs from the cathode to the anode. The voltage generated by the voltage source (bias supply) 808 (in this example 40V) generates an acceleration of the ions with an additional proportion Ubias+Uplasma, In FIG. 8, the cathode is hot-wired with the chamber and is thus laid to the chamber mass. It is however also possible to connect the cathode and the chamber over a voltage source and thus achieve an additional shift of potential. It is thus possible to achieve a plasma potential, at least in front of the anode, that is strongly positive. This is shown in FIGS. 10 and 11.

What is claimed is:

1. Arc deposition device, comprising:
a cathode (309) comprising an evaporating surface having material that is to be evaporated,
magnetic means (305) configured to generate a magnetic field over the evaporating surface of the cathode (309), wherein the magnetic field comprises magnetic field lines (311) exhibiting components parallel and perpendicular to the evaporating surface of the cathode and wherein the magnetic means (305) is positioned entirely behind a bottom surface of the cathode (309), wherein the bottom surface of the cathode (309) is opposite the evaporating surface of the cathode (309),
an anode (303) configured to absorb electrons extracted out of the cathode (309) during an evaporation process, and
a voltage source configured to put the anode (303) at positive potential relative to the cathode (309),
wherein the anode (303) is ring-shaped and includes an inner surface disposed adjacent to and facing an outer peripheral edge of the cathode (309) such that the cathode (309) is at least partially encircled by the inner surface of the anode (303) and wherein the inner surface of the anode (303) is parallel to the outer peripheral edge of the cathode (309) and the evaporating surface of the cathode (309) is in a plane that perpendicularly intersects a plane of the inner surface of the anode (303) and a portion of the anode (303) extends past the plane that the evaporating surface of the cathode (309) is in, and
the anode (303) is designed and arranged in combination with the magnetic field generated by the magnetic means (305) such that magnetic field lines (311b) are led from the evaporating surface of the cathode (309) to the anode (303) in a connection wherein the magnetic field lines (311b) hit the inner surface of the anode (303) at an angle within a range of greater than 45° and essentially 90°, the connection including
magnetic field lines (311b) having a component parallel to the evaporating srface of the cathode that is larger than a component of the magnetic field lines (311b) perpendicular to the evaporating surface of the cathode, and
the magnetic field lines (311b) exiting from around a central portion of the evaporating surface of the cathode (309) and having components parallel to the evaporating surface of the cathode (309) enabling the connection to the anode (303) from around the central portion of the evaporating surface of the cathode, and
the anode (303) in combination with the magnetic field generated by the magnetic means (305) is placed in a vicinity of the cathode (309) so that magnetic field lines (311b) enable a current path (307) in a direct line from an arc spot (315) to the anode (303),
wherein the anode is configured to create the connection when a predetermined voltage and magnetic field are applied and wherein a majority of the magnetic field lines (311b) with exception of central magnetic field lines (311a) lead to the anode (303), and
wherein the anode (303) and the cathode (309) are components separate from a vacuum chamber.

2. Arc deposition according to claim 1, wherein the inner surface of the anode (303) is arranged in relation to the outer peripheral edge of the cathode (309) such that the magnetic field lines (311b) that hit the anode (303) run essentially parallel to electric field lines that hit the anode (303).

3. Arc deposition device according to claim 1, wherein magnetic field lines (311a) exiting the central portion of the evaporating surface of the cathode (309) run perpendicular to the evaporating surface to prevent erosion of the central area of the evaporating surface of the cathode (309).

4. Arc deposition device according to claim 3, further comprising a shutter in the central area of the evaporating surface of the cathode (309).

5. Vacuum treatment device with a vacuum chamber and a substrate holder and with an arc deposition device according to claim 1.

6. Vacuum treatment chamber according to claim 5, wherein the cathode (309) of the arc deposition device is kept in relation to the vacuum chamber on one potential that is floating, at the same polarity or positive.

7. An arc deposition device, comprising:
a cathode comprising an evaporating surface having material that is to be evaporated and a spot configured to release electrons upon ignition of an arc;
magnetic means configured to generate a magnetic field over the evaporating surface of the cathode and a plurality of magnetic field lines (311) exiting from the evaporating surface of the cathode, wherein the magnetic field comprises magnetic field lines (311) exhibiting components parallel and perpendicular to the evaporating surface of the cathode and wherein the magnetic means (305) is positioned entirely behind a bottom surface of the cathode (309), wherein the bottom surface of the cathode (309) is opposite the evaporating surface of the cathode (309);
a voltage source for putting the anode at positive potential relative to the cathode, and
a ring-shaped anode (303) including an inner surface disposed adjacent to and facing an outer peripheral edge of the cathode (309) wherein the inner surface of the anode (303) is parallel to the outer peripheral edge of the cathode (309) and the evaporating surface of the cathode (309) is in a plane that perpendicularly intersects a plane of the inner surface of the anode (303) and a portion of the anode (303) extends past the plane that evaporating surface of the cathode (309) is in, the inner surface of the anode (303) connected with the cathode by the plurality of the magnetic field lines (311b) extending from the evaporating surface of the cathode (309) to the inner surface of the anode (303) in a connection wherein the magnetic field lines (311b) hit the inner surface of the anode (303) at an angle within a range of greater than 45° and essentially 90°, the connection including
magnetic field lines (311b) having a component parallel to the evaporating surface of the cathode that is larger than a component of the magnetic field lines (311b) perpendicular to the evaporating surface of the cathode, and
the magnetic field lines (311b) exiting from around a central portion of the evaporating surface of the cathode (309) and having components parallel to the evaporating surface of the cathode (309) enabling the connection to the anode (303) from around the central portion of the evaporating surface of the cathode, and
the anode (303) in combination with the magnetic field generated by the magnetic means (305) is placed in a vicinity of the cathode (309) so that magnetic field lines (311b) enable a current path (307) in a direct line from an arc spot (315) to the anode (303), wherein the anode is configured to create the connection when a predetermined voltage and magnetic field are applied and wherein a majority of the magnetic field lines (311b) with exception of central magnetic field lines (311a) lead to the anode (303), and wherein the anode (303) and the cathode (309) are components separate from a vacuum chamber.

8. The device according to claim 7, wherein the magnetic field lines (311b) are configured to enable a travel path of the electrons released from areas of the evaporating surface of the cathode other than the central portion of the evaporating surface of the cathode to be in a direct line from the evaporating surface of the cathode to the anode.

9. The device according to claim 7, wherein the anode is placed within a direct vicinity of the cathode.

10. The device according to claim 7, wherein a plurality of the magnetic field lines (311a) that exit the evaporating surface of the cathode from the central portion of the evaporating surface of the cathode run perpendicular to the evaporating surface of the cathode.

* * * * *